United States Patent
Rancoule

(10) Patent No.: US 8,298,333 B2
(45) Date of Patent: *__Oct. 30, 2012__

(54) CRUCIBLE FOR THE CRYSTALLIZATION OF SILICON AND PROCESS FOR MAKING THE SAME

(75) Inventor: Gilbert Rancoule, Marcq-en-Baroeul (FR)

(73) Assignee: Vesuvius Crucible Company, Wilmington, DE (US)

( * ) Notice: Subject to any disclaimer, the term of this patent is extended or adjusted under 35 U.S.C. 154(b) by 1242 days.

This patent is subject to a terminal disclaimer.

(21) Appl. No.: 12/089,147

(22) PCT Filed: Oct. 6, 2006

(86) PCT No.: PCT/EP2006/009671
§ 371 (c)(1),
(2), (4) Date: Apr. 3, 2008

(87) PCT Pub. No.: WO2007/039310
PCT Pub. Date: Apr. 12, 2007

(65) Prior Publication Data
US 2008/0260608 A1    Oct. 23, 2008

(30) Foreign Application Priority Data

Oct. 6, 2005  (EP) .................................... 05447224

(51) Int. Cl.
*C30B 15/10* (2006.01)
(52) U.S. Cl. ............................... 117/13; 117/20; 117/31
(58) Field of Classification Search .................... 117/13, 117/20, 31, 33, 200
See application file for complete search history.

(56) References Cited

U.S. PATENT DOCUMENTS

| | | | |
|---|---|---|---|
| 4,218,418 A | 8/1980 | Schmid et al. | |
| 4,741,925 A | 5/1988 | Chaudhuri et al. | |
| 6,165,425 A | 12/2000 | Lange et al. | |
| 7,833,490 B2 * | 11/2010 | Rancoule | 422/557 |

FOREIGN PATENT DOCUMENTS

| | | |
|---|---|---|
| EP | 04447105 | 9/1991 |
| EP | 1899508 | 1/2007 |
| WO | 2004/053207 A1 | 6/2004 |
| WO | 2005/106084 | 11/2005 |
| WO | 2007/003354 | 1/2007 |

* cited by examiner

*Primary Examiner* — Bob M Kunemund
(74) *Attorney, Agent, or Firm* — Thomas Clinton; Donald M. Satina

(57) ABSTRACT

A protective coating is prepared for, and applied to, crucibles used in the handling of molten materials that are solidified in the crucible and then removed as ingots. Crucibles containing this protective coating may be used for the solidification of silicon. The coating has a specified oxygen content and contains a mineral binder and silicon nitride or silicon oxynitride.

16 Claims, 1 Drawing Sheet

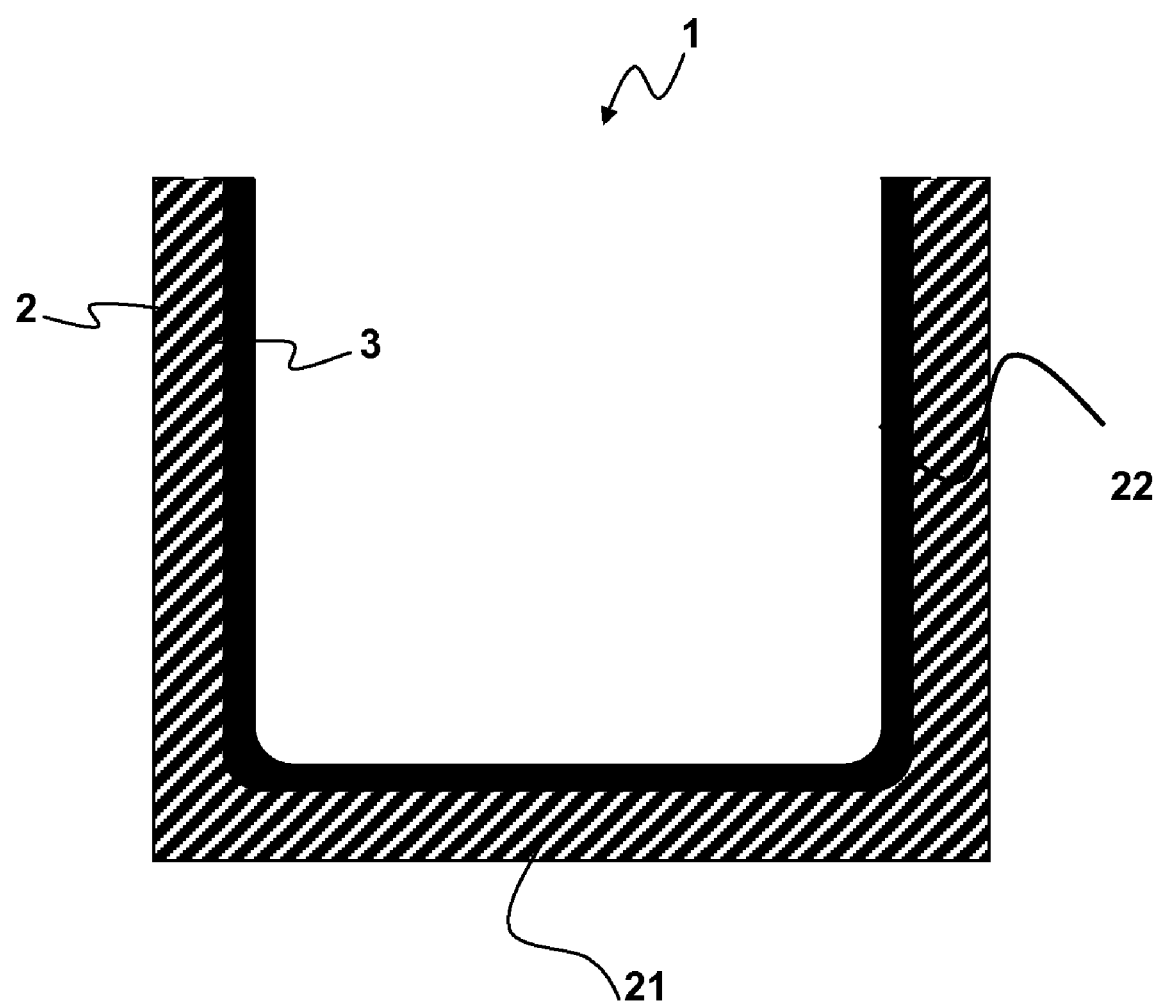

CRUCIBLE FOR THE CRYSTALLIZATION OF SILICON AND PROCESS FOR MAKING THE SAME

FIELD OF THE INVENTION

The invention relates to a crucible for the crystallization of silicon and to the preparation and application of a protective coating for crucibles used in the handling of molten materials that are solidified in the crucible and then removed as ingots, and more particularly to protective coating for crucibles used in the solidification of polycrystalline silicon.

BACKGROUND OF THE INVENTION

Crucibles (for instance made of fused silica, silicon carbide, quartz, silicon nitride, reaction bonded silicon nitride, or graphite) are typically used in solidification of polycrystalline silicon. Silica is chosen primarily for high purity and availability. There are problems in using silica, however, as a crucible for the production of silicon by this method.

Silicon in its molten state will react with the silica crucible that is in contact with it. Molten silicon reacts with silica to form silicon monoxide and oxygen. Oxygen will contaminate the silicon. Silicon monoxide is volatile, and will react with the graphite components inside the furnace. Silicon monoxide reacts with graphite to form silicon carbide and carbon monoxide. The carbon monoxide will then react with the molten silicon, forming additional volatile silicon monoxide, silicon carbide, carbides and oxides of metallic traces or additives and carbon. Carbon will contaminate the silicon. Silicon can also react with the various impurities contained in the crucible (iron, boron, aluminum, . . . ) and/or contained in the nitride coating.

The reaction between silica and silicon promotes adhesion of the silicon to the crucible. This adhesion, combined with a difference in coefficients of thermal expansion between the two materials, creates stress in the silicon ingot, causing it to crack on cooling. It is known in the art that a protective coating applied to the inside of the crucible in the area of contact with the ingot can prevent the reaction between silicon and silica that leads to ingot contamination and cracking. To be effective, the coating must be thick enough to prevent the silicon from reacting with the silica crucible, and must not adversely contaminate the silicon either by itself or from contaminants within it.

A variety of materials and techniques are described in the literature, which attempt to solve the problem of reaction and adhesion of the crucible in contact with molten material.

Silicon nitride coatings are known to prevent the chemical reaction between molten silicon and silica from the crucible. U.S. Pat. No. 4,741,925 describes a silicon nitride coating for crucibles applied by chemical vapor deposition at 1250° C. while WO-A1-2004/053207 discloses a silicon nitride coating applied by plasma spraying. U.S. Pat. No. 4,218,418 describes a technique of forming a glass layer inside a silica crucible by rapid heating to prevent cracking of silicon during melt-processing.

Prior art includes specific references to powdered mold release agents for application to crucibles in the directional solidification of silicon. In addition, the use of chemical vapor deposition, solvent evaporation, high-temperature flame treatment, and other expensive and complex means are mentioned for application of crucible coatings. References are made to specific binders and solvents. References are made to mixing, spraying, or brushing for slurries of powdered coatings.

Silicon nitride coatings are known to prevent the chemical reaction between molten silicon and silica from the crucible. However, the silicon nitride coating itself can lead to problems. The thickness of the silicon nitride coating necessary to prevent the silicon from reacting with the silica crucible is quite important (about 300 μm) making thereby the coating operation expensive and time consuming. Further, this silicon nitride coating is mechanically weak and can peel or flake off during or even before use. It is therefore recommended to apply this coating at the very last moment before use, i.e., at the end user facilities, leaving thereby the burden of applying this thick coating to the end user.

The known technologies to provide a stable nitride coating onto a ceramic crucible include (1) the oxidation of the nitride coating at high temperature ranging from 700° C. to 1450° C. under a controlled burnout cycle and (2) the addition of sintering/sticking (or adherence) aids to the nitride composition. Additives can be metals or oxides additives such as $Al_2O_3$, $SiO_2$, AlN, Al, Si, fume or fine silica and others. A silicon nitride coating comprising fume silica is described in the co-pending application EP04447105. The oxidation of the silicon nitride into silicon oxide increases the quantity of oxygen in the coating and leads to the problem mentioned above. In addition the level of oxidation and resulting amount of oxygen is not easy to control.

The need to maintain low oxygen content in the crucible coating was highlighted by most of the publications of silicon producers describing the chemical and physical interactions during photovoltaic and semi-conductor application. The use of low oxygen silicon nitride coating is recommended for high quality wafer production. The use of high purity silicon nitride powder with low oxygen content has been described notably in U.S. Pat. No. 6,165,425. This document describes a silicon nitride coating which has an extremely low oxygen content ranging from 0.3% to at most 5% by weight. The coating can comprise adhesion promoters such as polyvinyl alcohol and is dried in air at a temperature preferably ranging from 500° to 700° C. At these low drying temperatures, the oxidation of the silicon nitride does not take place, there is no formation of $SiO_2$ on the grains boundary and the full effectiveness of the silicon nitride is kept. However, some problems remain. As there is no oxidation of the coating, the coating remains pulverulent and is easily damaged when liquid silicon is charged into the crucible.

SUMMARY OF THE INVENTION

It is therefore desirable to provide a crucible which does not present the above problems comprising a coating which is stronger (avoid peeling and flake off), with improved mechanical wear resistance, fast and cheap to produce while preventing chemical reaction between molten silicon and the crucible and maintaining the additional requirements in terms of oxygen content. It has now been found that these problems can be solved with a crucible for the crystallization of silicon comprising a) a base body comprising a bottom surface and side walls defining an inner volume; b) a silicon nitride based protective coating at the surface of the side walls facing the inner volume, said coating comprising 80 to 95 wt. % of silicon nitride and 5 to 20 wt. % of a low temperature mineral binder, the total oxygen content ranging from 5 to 15% by weight. Preferably, the low temperature binder is a silica based binder. Silicon oxinitride powder and preferably a combination of silicon nitride and silicon oxinitride powders can also be used. The silicon oxinitride powder is generally comprised between 5 and 20 wt. %. The silicon oxinitride powder may be a recycled oxinitride or a water activated oxinitride.

One considerable advantage of the present invention is that the amount content of oxygen in the silicon nitride powder is not critical anymore and the use of a powder comprising a certain amount of oxygen as for instance a recycled powder can be considered. The crystallographic phase of the silicon nitride powder can be α or β.

The expression "low temperature binder" is used herein to refer to a binder that creates a bond at a temperature lower than the temperature required to oxidise the silicon nitride. Preferably the bond is created at a temperature lower than 800° C. and more preferably lower than 500° C.

By mineral binder, it is intended to refer to a binder comprising a mineral base having residues that always give a mineral form plus carbon or not. This is in contrast to organic binders such as CMC (carboxymethylcellulose), glue, and surfactants that give residues which are only carbon. The high reactivity of the binder is partly given by the mineral base.

The granulometry of the silicon nitride or silicon oxinitride powder is generally submicronic, particle size ≦1 μm. However, a blend of nitride powders comprising different particle sizes and notably comprising coarser particles or grains comprised between 2 and 50 μm, preferably between 2 and 5 μm can also be used. The blend is chosen so as to improve one or more characteristics. The blend can improve the stability of the suspension and/or further increase the adhesion of the coating onto the crucible. In case another coating is present under and/or on the top of the nitride coating according to the present invention, a blend can also facilitate the adhesion between the different coatings. The other coating can be for instance a silica based coating as described in patent application WO2005/106084 and co-pending application PCT/EP2006/006347. The quantity of coarser particles is generally comprised between 20 and 50% by weight with respect to the submicronic particles. Coarser silicon nitride powder is less expensive, the introduction of such powder also reduces the cost of the coating.

Depending upon the application, the protective coating will have a thickness of 50 μm to 500 μm, preferably of 200 to 500 μm. To avoid any contamination, it is essential that the protective coating be of very high purity with an ultra-low carbon content.

This new technology is based on the use of limited and controlled amounts of oxygen in the coating. The oxygen is introduced with a low temperature mineral binder (sol gel, organo-metallic, nano-particles, micro-flocculent, non miscible solutions, micro-emulsions, oxides). A very low temperature bonding phase is created throughout the coating increasing the mechanical wear resistance of the protective coating while keeping the desired properties of the silicon nitride. Risk of peeling and flaking off of the coating is much reduced.

The additives and quantities are chosen so as to obtain a total oxygen content ranging from 5 to 15 wt. % and most preferably from 8 to 12 wt. %. A total oxygen content lower than 5% does not provide a sufficient bonding phase resulting in low mechanical resistance of the coating. When the content of oxygen is too high, the problems of contamination explained above are present.

The heating temperature to create the bond is lower than the temperature required to oxidise the silicon nitride. The heating temperature is lower than 800° C. and preferably lower than 500° C. This way, the amount of oxygen is fully controlled by the addition of the determined quantity of low temperature mineral binder. There is no further reaction of oxidation which could modify the oxygen content.

The oxygen in the bond dispersion is making a difference versus oxygen produced by silicon nitride oxidation. The low cohesion between the bonding system and the nitride powder permits the retention of the full effectiveness of the nitride as non wetting agent. The chemical bond is created around the grains and the grains of silicon nitride are not oxidized into $SiO_2$ on their periphery. This effect is enhanced by the low temperature densification required for a bond created by chemical setting instead of the typical thermal reaction of oxidation. The coating of the present invention permits the increase of the mechanical resistance of the coating by the means of a well controlled binding system while keeping the full effectiveness of the silicon nitride grains.

Since there is no problem of peeling or flaking off with the coating according to the invention, it can be prepared before reaching the end user facilities.

Another object of the invention is a composition for coating a crucible for the crystallization of silicon comprising 80 to 95 wt. % of silicon nitride and 5 to 20 wt. % of a low temperature mineral binder, the total oxygen content being higher than 5% by weight. The composition can be applied by different methods. In a preferred method, the composition is mixed with liquid phase to form a suspension for application onto the crucible.

Another object of the invention is a process for making a crucible comprising a protective coating according to the invention; the process comprising the steps of
a) providing a base body comprising a bottom surface and side walls defining an inner volume and
b) applying a protective coating comprising 80 to 95 wt. % of silicon nitride and 5 to 20 wt. % of a low temperature mineral binder, the total oxygen content being higher than 5% by weight at the surface of the side walls facing the inner volume.

Usually, the surface layer will be applied in water or in solvent by spraying or brushing, preferably by spraying in a water based system comprising an appropriate amount of water to permit the suspension of the whole composition.

In a preferred embodiment of the process according to the invention, the step of applying the coating is followed by a heating step c) at a temperature and for a duration appropriate to calcinate substantially all the organic compound present in the coatings and to create the bond. In a preferred embodiment, the heating temperature remains under the temperature of oxidation of the silicon nitride. This way, the oxygen content in the coating is kept under control. The temperature of oxidation of the silicon nitride may vary depending on the coating composition but is usually about 800° C. The heating of the coated crucible may also take place at the Customer site. It is also possible to make a preheating before shipment to the customer and the final or further heating at the customer site.

BRIEF DESCRIPTION OF THE DRAWING

FIG. 1 shows a cross-section of a crucible according to the invention.

DETAILED DESCRIPTION OF THE INVENTION

The invention will now be described with reference to the enclosed figure which only serves to illustrate the invention and is not intended to limit its scope. On the figure, the crucible is designated with reference number 1. It comprises a base body 2 comprising a bottom surface 21 and side walls 22 which define an inner volume for the crystallization of silicon. The crucible comprises a protective layer 3 which is comprised of 80 to 95 wt. % of silicon nitride, 5 to 20 wt % of a low temperature mineral binder, the total oxygen content being higher than 5% by weight at the surface of the side walls 22 facing the inner volume.

The invention will now be illustrated by way of examples according to the invention and comparative examples. The process to apply the coating on the base body can be achieved in different ways. The composition depends on the method chosen.

The first preferred method (reactive layer) comprises the step of
- mixing silicon nitride powders and organo-metallic compound based on silicon chemistry preferably selected from the group constituted of as siloxane, tetraethylorthosilicate, tetraethoxysilane, polydimethylsilane or a combination thereof (organo-metallic compounds are known as such and available on the market);
- spraying the coating onto the crucible by a reactive liquid from the family of ammonium chloride, ammonia, nitric solution or any other reactive liquid suitable for this process;
- heating the coated crucible at a temperature below 500° C. for stabilisation of the coating.

The second preferred method (binder solution) comprises the step of
- mixing silicon nitride powders with a silica based binder preferably selected from the group constituted of silicone oil, siloxane, chlorosilane or a combination thereof;
- spraying the coating by a reactive liquid from the family of acids (hydrochloric acid, nitric acid, silicic acid, silicon tetrachloride or any other suitable acid for this process) as neutralisation for base hydrolysis as for amino-organo metallic compounds;
- heating the coated crucible at a temperature below 500° C. to remove reaction liquids.

In another embodiment, the spraying step is performed using a reaction based on ammonia vapors or solutions for acid hydrolysis systems.

The third preferred method (saturated solution and precipitation) comprises the step of
- mixing silicon nitride powders with submicronic particles (with diameters $<10^{-6}$ m) and/or nano-particles of silica adapted to form a suspension, preferably colloidal silica;
- precipitation of the prepared mixture on the crucible surface through thermal reaction, vapor reaction, or even chemical direct reaction using the appropriate neutralisation chemical to form acid base, alcohol, or pH reaction;
- heating the coated crucible at a temperature below 500° C., preferably before use.

Examples of coating compositions for the three methods are shown in table 1.

TABLE I

| | protective coating composition | | | | | | |
|---|---|---|---|---|---|---|---|
| | Method 1 | | | Method 2 | | Method 3 | |
| Wt % | 1a | 1b | 1c | 2a | 2b | 3a | 3b |
| Silicon nitride | 95 | 85 | 85 | 95 | 85 | 95 | 85 |
| Silicon oxinitride | | | 10 | | | | |
| Silicone oil | | | | 5 | 10 | | |
| TEOS | 5 | 15 | 5 | | | | |
| Colloidal silica | | | | | 5 | 5 | 10 |
| PVA/PEG | | | | | | | 5 |

TABLE I-continued

| | protective coating composition | | | | | | |
|---|---|---|---|---|---|---|---|
| | Method 1 | | | Method 2 | | Method 3 | |
| Wt % | 1a | 1b | 1c | 2a | 2b | 3a | 3b |
| Silic acid | | | | Y | | | |
| Ethanol-water | | Y | | | Y | | |
| Water | Y | | Y | | | | Y |

PVA means polyvinyl alcohol and PEG means polyethylene glycol.
TEOS means tetraethylorthosilicate.

The preferred examples are the colloidal silica based compositions as they are easy and safe to handle. The compositions are chosen as a function of the method used, to obtain the targeted oxygen content and mechanical wear resistance.

In the following tables, the adhesion of the various coatings onto the crucible has been determined in accordance with ASTM D4541 using a POSITEST PULL-OFF ADHESION TESTER (from the firm DEFELSKO Corp.). This tester evaluates the adhesion of the coating by determining the greatest tensile pull off force that it can bear before detaching. i.e., the force required to pull a specified test diameter of coating away from its substrate using hydraulic pressure. The force is expressed in term of pressure (kPa).

Examples of crucible and related performances are shown in table 2:

TABLE 2

| example | Protective coating | Crucible | Adhesion of the surface coating |
|---|---|---|---|
| 1 | 1b | Silica | Good |
| 2 | 1b | Quartz | Excellent |
| 3 | 3a | Silica | good |
| 4 | 3b | RBSN | excellent |
| 6* | C1 | Quartz | Poor |
| 7* | C2 | Quartz | Poor |

6 and 7 are comparative examples.
RBSN means "reaction bonded silicon nitride" and is a known type of crucible. 6 and 7 are comparative examples and correspond to examples 1 and 2 of U.S. Pat. No. 6,165,425. C1 comprises a silicon nitride powder with an oxygen content of 1.3% and no low temperature mineral binder. C2 comprises a silicon nitride powder with an oxygen content of 6% and no low temperature mineral binder.

Regarding example 6, damage of the coating was noticed when charging silicon metal into the crucible. Regarding example 7, considerable loss of material was noticed as explained in U.S. Pat. No. 6,165,425.

I claim:

1. A crucible for the crystallization of silicon comprising:
   a) a base body comprising a bottom surface and side walls defining an inner volume;
   b) a silicon nitride based protective coating facing the inner volume; wherein said protective coating comprises from 80 to 95 wt. % of silicon nitride and from 5 to 20 wt. % of a low temperature mineral binder, and a total oxygen content from 5 to 15% by weight.

2. The crucible according to claim 1, wherein the coating comprises a total oxygen content from 8 to 12% by weight.

3. The crucible according to claim 1, wherein the silicon nitride protective coating has a thickness from 50 µm to 500 µm.

4. The crucible according to claim 3, wherein the silicon nitride protective coating has a thickness from 200 µm to 500 µm.

5. The crucible according to claim 1, wherein the silicon nitride coating comprises particles having a diameter less than or equal to 1 µm.

6. The crucible according to claim 5, wherein the silicon nitride protective coating further comprises coarser particles.

7. The crucible according to claim 6, wherein the silicon nitride protective coating comprises coarser particles having diameters from 2 μm to 50 μm.

8. The crucible according to claim 6, wherein the silicon nitride protective coating comprises coarser particles having diameters from 2 μm to 5 μm.

9. The crucible according to claim 6, wherein the silicon nitride protective coating comprises from 20 to 50% by weight coarser particles.

10. The crucible according to claim 1, wherein the low temperature mineral binder comprises an organo-metallic compound based on silicon chemistry selected from the group consisting of siloxane, tetraethylorthosilicate, tetraethoxysilane, polydimethylsilane and a combination thereof.

11. The crucible according to claim 1, wherein the low temperature mineral binder comprises a silica based binder selected from the group consisting of silicone, siloxane, chlorosilane and a combination thereof.

12. The crucible of claim 1, wherein the low temperature mineral binder comprises particles selected from the group consisting of submicronic particles of silica, nanoparticles of silica and combinations thereof, and wherein the particles are adapted to form a suspension.

13. The crucible of claim 1, wherein the low temperature mineral binder comprises particles selected from the group consisting of submicronic particles of silica, nano-particles of silica and combinations thereof, and wherein the particles are adapted to form a silica colloid.

14. Process for the preparation of a crucible for the crystallization of silicon comprising the steps of:
 a) providing a base body comprising a bottom surface and side walls defining an inner volume; and
 b) applying a protective coating comprising 80 to 95 wt. % of silicon nitride and 5 to 20 wt. % of a low temperature mineral binder, wherein the total oxygen content is higher than 5% by weight at the surface of the side walls facing the inner volume.

15. Process according to claim 14, further comprising:
 c) heating the coated crucible at a temperature lower than the temperature of oxidation of the silicon nitride.

16. Process according to claim 14, wherein step b) is carried out by spraying.

* * * * *